(12) United States Patent
de Ambroggi et al.

(10) Patent No.: US 7,295,477 B2
(45) Date of Patent: Nov. 13, 2007

(54) SEMICONDUCTOR MEMORY DEVICE AND METHOD FOR WRITING DATA INTO THE SEMICONDUCTOR MEMORY DEVICE

(75) Inventors: Luca de Ambroggi, Dresden (DE); Thomas Kern, Munich (DE)

(73) Assignee: Infineon Technologies Flash GmbH & Co. KG, Dresden (DE)

( * ) Notice: Subject to any disclaimer, the term of this patent is extended or adjusted under 35 U.S.C. 154(b) by 86 days.

(21) Appl. No.: 11/229,003

(22) Filed: Sep. 16, 2005

(65) Prior Publication Data

US 2007/0064499 A1    Mar. 22, 2007

(51) Int. Cl.
*G11C 7/10* (2006.01)

(52) U.S. Cl. .................. 365/189.04; 365/185.28; 365/185.23

(58) Field of Classification Search ........... 365/189.04, 365/185.28, 185.14, 185.18, 185.23
See application file for complete search history.

(56) References Cited

U.S. PATENT DOCUMENTS

| 5,453,950 A | * | 9/1995 | Voss et al. ............... 365/156 |
| 6,011,725 A | | 1/2000 | Eitan |
| 6,829,173 B2 | | 12/2004 | Ooishi |
| 2006/0062054 A1 | * | 3/2006 | Hamilton et al. ...... 365/189.07 |
| 2006/0256621 A1 | * | 11/2006 | Ambroggi et al. ..... 365/185.28 |

* cited by examiner

*Primary Examiner*—Richard T. Elms
*Assistant Examiner*—Dang Nguyen
(74) *Attorney, Agent, or Firm*—Slater & Matsil, L.L.P.

(57) ABSTRACT

A semiconductor memory device comprises a wordline (40), a first bitline (21a), two second bitlines (22a, 22b), a first memory cell (100a) and a second memory cell (100b). The first memory cell (100a) is coupled to the wordline (40), one of the second bitlines (22a) and the first bitline (21a). The second memory cell (100b) is coupled to the wordline (40), the other second bitline (22b) and the first bitline (21a). Each memory cell (100a, 100b) stores a first bit (101) and a second bit (102). The semiconductor device further comprises a programming unit (2) coupled to the wordline (40) and the first and the second bitlines (21a, 22a, 22b). The programming unit (2) enables to apply a first programming potential (V1) to the wordline (40) and to apply a third programming potential (V3) to the second bitlines (22a, 22b) while applying a second programming potential (V2) to the first bitline (21a) in order to program the first bit (101) of the second memory cell (100b) and the second bit (102) of the first memory cell (100a).

32 Claims, 5 Drawing Sheets

SEMICONDUCTOR MEMORY DEVICE AND METHOD FOR WRITING DATA INTO THE SEMICONDUCTOR MEMORY DEVICE

TECHNICAL FIELD

The present invention generally relates to a semiconductor memory device, more particularly to a multi-bit memory cell array, and further concerns a method for writing data into such a semiconductor memory device.

BACKGROUND

Portable devices such as digital cameras and music players comprise non-volatile memory units. These portable devices have become smaller in recent years, as have the respective memory units. It is assumed that the miniaturization of portable devices will proceed. In order to fulfill the need for improved performance of the device the amount of data that can be stored in the non-volatile memory unit may increase. As a result, for example more music, photos or other data can be stored in smaller devices.

Non-volatile memory units may be designed in the form of electrical erasable programmable read-only memory (EEPROM). The EEPROM can be electrically programmed and electrically erased. It retains stored data for a long time without a power supply and can easily be programmed and erased many times.

The EEPROM comprises a plurality of memory cells for storing small pieces of information. Memory cells may enable to store only one bit. Multi-bit memory cells, however, can store more than one bit. A so-called nitride programmable read-only memory cell (NROM cell) is operable to store two bits. The NROM cell is described in U.S. Pat. No. 6,011,725.

An embodiment of the NROM memory cell comprises a transistor body that includes a cell well, having a first and a second doping area. A channel region is located between the doping areas. A gate electrode is arranged above the channel region insulated by a dielectric layer, which is arranged between the channel region and the gate electrode. The dielectric layer comprises a first oxide layer, a nitride layer, e.g., silicon nitride, and a second oxide layer. The nitride layer of such a memory cell serves as a charge-trapping layer sandwiched between the insulating oxide layers, which avoid vertical retention. Alternative material for forming the charge-trapping layer, are also possible.

Two individual bits are stored in different regions of the nitride layer. A first bit region is near the first doping area and a second bit region is near the second doping area.

The bits are programmed by means of channel hot electron programming. Electrons are injected from the channel into the charge-trapping layer. Programming of the first bit is performed by applying programming potential to the first doping area and to the gate, while grounding the second doping area. Typically, programming potentials of 9 V are applied to the gate and of 4.5 V are applied to the first doping area, respectively. Thus, the electrons are injected and trapped into the first bit region, which is adjacent to the first doping area. Likewise, programming of a second bit is performed by applying the programming potentials to the second doping area and to the gate while grounding the first doping area. In this case, the electrons are injected and trapped into the second bit region. Typically, the programming potentials are applied repeatedly in such a way that pulses are applied to the memory cells.

For erasing a bit, injection of hot holes generated by band to band tunnelling can be used. Erasing of the first bit is performed by applying erasing potentials to the gate or to the first doping area and the gate. Typically, about 8 V are applied to the first doping area and a negative voltage related to ground is applied to the gate. The applied voltages result in a lateral field. Holes are caused to flow through the bottom oxide layer for compensating the charge of the electrons, which are trapped. The second bit is erased by applying the respective erasing potentials to the gate and to the second doping area.

The bit is read by applying a reverse voltage between the first and second doping area compared to the programming voltage that is used to program this bit. Typically, a reading potential of 1.5 V is applied to the second doping area while grounding the first one, in order to read the first bit. Relatively small charges near the first doping area prevent or reduce current flow. The current flows while there is no trapped charge inside the first bit region. Reading the second bit is performed by applying the respective reading potential to the first doping area while grounding the second one.

A memory cell array includes a plurality of memory cells arranged as a matrix, having rows and columns. One of a plurality of wordlines connects the gate electrodes, which are arranged in the same row. The first doping areas of memory cells which are arranged in the same column and the second doping areas of the memory cells arranged in the adjacent column, form a bitline between these two columns of memory cells. Thus, a potential applied to one of the wordlines is applied to the gate electrode of each memory cell of that row. Likewise, a potential that is applied to one of the bitlines is applied to the first doping area of the memory cells located on one side of that bitline and to the second doping area of the memory cells located on the other side of that bitline.

Each memory cell can be identified by the wordline and the bitlines on either side, which are coupled to that memory cell. Thus, programming, erasing or reading of one of the memory cells is performed by applying the programming potentials, erasing potentials or reading potentials, respectively, to the wordline and the bitlines connected to that memory cell.

The bitlines are coupled to a bitline decoder. The wordlines are coupled to a wordline decoder. The bitline decoder is operable to apply the programming, reading or erasing potentials to each bitline, in particular to a pair of adjacent bitlines in order to program, read or erase the memory cells coupled to these two bitlines. The wordline decoder is operable to apply the programming or erasing potential to each of the wordlines. The bitline decoder and the wordline decoder are coupled to an address decoder, which is operable to identify the memory cells to be programmed, erased or read. The address decoder is further operable to control the bitline decoder and the wordline decoder, in order to access these memory cells.

Programming may be performed in a row or in a column. That means, the programming of several memory cells, which are located in the same column, may be performed by applying the programming potentials to the two bitlines, which are connected to the memory cells of the column and to the wordlines, which are connected to the memory cells to be programmed. Thus, either the first bits or the second bits are programmed. Programming the other bits of the memory cells in this word is performed by switching the programming potentials applied to the bitlines. Thus, two separate programming steps, including charging and decharging the bitlines, are necessary in order to program the first and second bits.

Likewise, the memory cells located in the same row can be programmed by applying the programming potentials to one wordline and a plurality of bitlines.

Charging the bitlines is time and power consuming. The bitlines require a large amount of energy to be loaded into it and to be charged to the right programming voltage level. The loading of the bitlines occur each time a programming pulse has to be applied. The required energy and a current consumption due to charging, depend on the length of the bitlines and the number of bitlines, which are loaded in parallel. The current consumption may be a limiting factor in the architecture of long bitlines and also limits the number of columns or rows to be programmed in parallel.

SUMMARY OF THE INVENTION

Embodiments of the invention enable the programming of a first bit stored in a second memory cell and a second bit stored in a first memory cell in a time and energy efficient way during the same programming step.

The first memory cell and the second memory cell are coupled by a same wordline and a same first bitline. A second bitline is coupled to each of the first memory cell and the second memory cell. A programming unit is operable to apply a first programming potential to the wordline and a third programming potential to the second bitlines, while applying a second programming potential to the first bitline in order to program the first bit of the second memory cell and the second bit of the first memory cell. The respective bit regions of the first bit of the second memory cell and the second bit of the first memory cell are located on either side of the first bitline.

Advantageously, the third programming potential is applied in consecutive pulses to the second bitlines while applying the second programming potential to the first bitline continuously. Applying at least one of the programming potentials in pulses enables to adjust the amount of charges that are trapped in the charge-trapping layer, because a quantum of charges is transferred each time a pulse is applied. Applying pulses to the second bitlines, without discharging the first bitline, permits to keep programming operation speed while reducing by half the number of bitlines charged up for consecutive programming pulses.

The pulses of the third programming potentials may apply simultaneously to the second bitlines. Alternatively, the pulses may be applied to one of the second bitlines first and then to the other one or the pulses are applied alternately to the second bitlines without discharging the first bitline. In the latter cases, the current consumption is reduced.

A development of the invention concerns a plurality of memory cells coupled to a plurality of wordlines and a plurality of bitlines forming a memory cell array. The development comprises the programming unit that enables the programming of several pairs of the memory cells each including a first and a second memory cell. The first and the second memory cell are coupled by the same wordline and the same bitline. The first memory cell is coupled to a second bitline and the second memory cell is coupled to another second bitline.

Advantageously, the pairs of memory cells are programmed in a row or in a column. Programming in a column comprises applying the second programming potential to one first bitline and applying the third programming potential to the respective second bitlines. The first programming potential is applied to the wordlines which are connected to the pairs of memory cells to be programmed.

Programming in a row is performed by applying the first programming potential to one wordline and applying the second programming potential to a plurality of first bitlines. The third programming potential is applied to the respective second bitlines.

The third programming potential is applied in pulses without discharging the second programming potential. The pulses may be applied simultaneously to the second bitlines.

This approach permits to keep programming operation speed while reducing by half the number of bitlines charged up for consecutive programming pulses.

Applying the third programming potential to the second bitlines coupled to the first memory cells and to the second bitlines coupled to the second memory cells, alternately, is also possible. Alternatively, a sequence of pulses is applied to the second bitlines coupled to the first memory cells and then to the second bitlines coupled to the second memory cells.

Applying the pulses to the bitlines in rotation or one after another results in less current consumption.

It is also possible to apply the first programming potential in pulses while applying the second and third programming potential continuously.

Advantageously, the programming unit is operable to switch between applying the first programming potential in pulses and applying the third programming potential in pulses based on the capacitive load of the wordlines and bitlines the programming potentials have to be applied to. Switching depends on whether charging the wordlines or charging the second bitlines requires more energy.

The method for writing data into such a semiconductor memory device comprises the steps of applying the first programming potential to at least one of the wordlines for a first time interval, applying the second programming potential to at least one of the first bitlines for a second time interval, applying the third programming potential to the respective second bitlines coupled to the first memory cells for a third time interval and applying the third programming potential to the respective second bitlines coupled to the second memory cells for a fourth time interval. The first, the second and the third time interval as well as the first, the second and the fourth time intervals overlap in order to program the first bits of the second memory cells and the second bits of the first memory cells.

If the third and fourth time intervals overlap, the bits are programmed simultaneously. If the third and fourth time intervals do not overlap, the bits may be programmed one after another.

Advantageously, the first and/or the third programming potentials are applied in pulses during the second time interval when the second programming potential is applied to the first bitlines continuously.

BRIEF DESCRIPTION OF THE DRAWINGS

For a more complete understanding of the present invention and its advantages, reference is now made to the following description taken in conjunction with the accompanying drawings in which.

The following list of reference symbols can be used in conjunction with the figures:

| | |
|---|---|
| 2 | programming unit |
| 2X | bitline decoder |
| 2Y | wordline decoder |
| 21, 21a, 21b | bitlines |
| 22, 22a, 22b | bitlines |
| 24 | insulating area |
| 25, 25a, 25b | switches |
| 26, 26a, 26b | switches |
| 31 | first main bitline |
| 32 | second main bitline |
| 40, 50 | wordlines |
| 51 | first direction |
| 52 | second direction |
| 100 | memory cell |
| 100a | firstmemory cell |
| 100b | second memory cell |
| 101 | first bit |
| 102 | second bit |
| 111 | pair of memory cells |
| 200 | doping area |
| 250 | substrate |
| 251, 252, 253 | oxide-nitride-oxide layer |
| 254 | channel region |
| 255 | cell well |
| 400 | gate electrode |
| V1 | first programming potential |
| V2 | second programming potential |
| V3 | third programming potential |

DETAILED DESCRIPTION OF ILLUSTRATIVE EMBODIMENTS

Preferred embodiments are discussed in detail below. It should be noticed that the present invention provides many applicable concepts that can be embodied in a wide variety of specific contexts. The specific embodiments discussed are merely illustrative of specific ways to make and use the invention and do not limit the scope of the invention.

Figure 1:
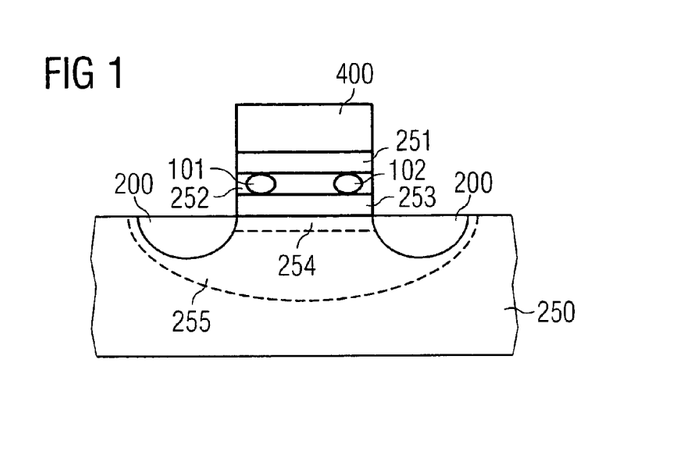
FIG. 1 shows a cross-section of a NROM memory cell.

FIG. 1 shows an embodiment of an NROM memory cell. The memory cell comprises a transistor body including a cell well 255 which has two doping areas 200. A channel region 254 is located between the doping areas 200. A gate electrode 400 is arranged above the channel region 254 insulated by an oxide-nitride-oxide layer 251, 252, 253, wherein the nitride layer 252 serves as a charge-trapping layer.

A first bit 101 and a second bit 102 can be stored within different areas of the charge-trapping nitride layer 252. If a certain amount of charge is trapped in one of these areas the respective bit is called "programmed" representing a logical 0. If less than the certain amount of charge or no charge is trapped within this area the respective bit is called "erased" representing a logical 1. The first and the second bit 101, 102 are indicated in FIG. 1 by two circles. An empty circle represents the erased bit and a filled-in circle represents the programmed bit.

Figure 2:
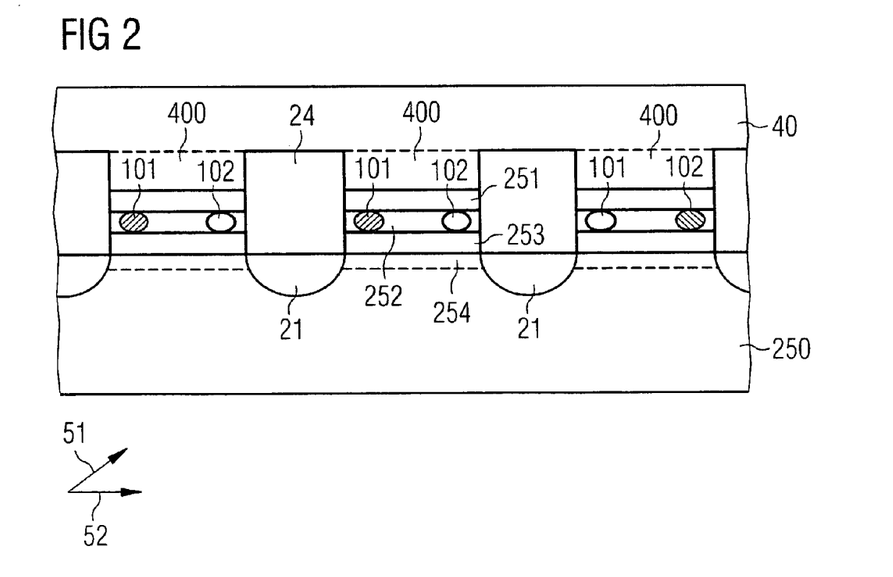
FIG. 2 shows a cross-section of a NROM memory cell array.

FIG. 2 shows a cross-section along a wordline 40 of a memory cell array. The memory cell array comprises a plurality of memory cells arranged as an array having rows and columns. The columns are arranged parallel to a first direction 51 which is normal to the cross-section. The rows are arranged parallel to a second direction 52 which may be orthogonal to the first direction 51.

The memory cells are connected by a plurality of wordlines 40 and bitlines 21. The wordlines 40 are arranged parallel to the second direction 52. Each wordline 40 connects the gate electrodes 400 of the memory cells which are arranged in a same row. Each bitline 21 is disposed between adjacent columns of memory cells forming the doping areas of the memory cells on either side of the bitline 21. However, the doping areas located on one side of the memory cells arranged in a same column are formed by a same bitline 21. The doping areas located on the other side of the memory cells arranged in the same column are formed by a further same bitline 21.

The bitlines 21, are insulated from the wordlines 40, by insulating areas 24 which are located on the bitlines 21.

Figure 3:
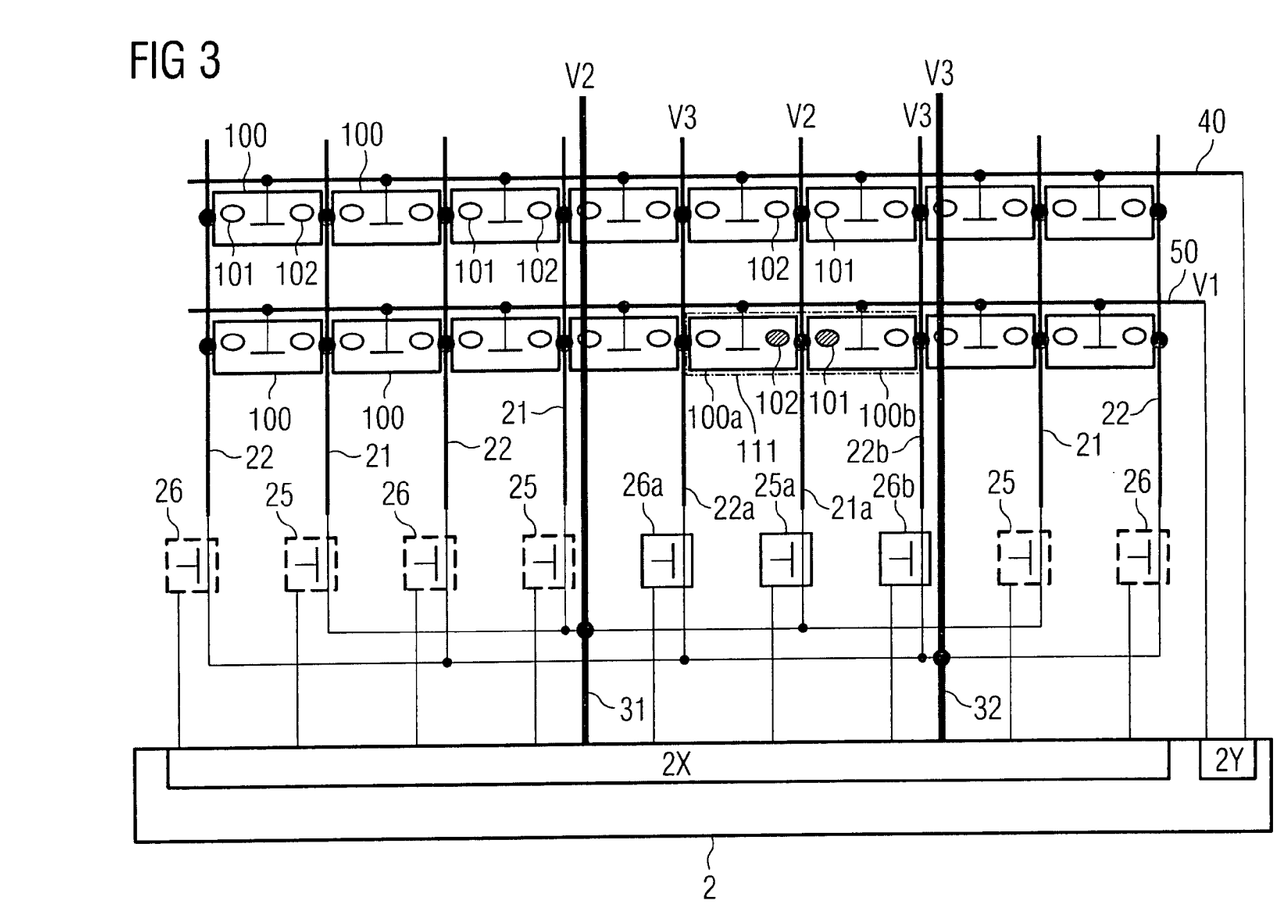
FIG. 3 shows a block diagram of a memory cell array illustrating programming of two bits stored in a pair of memory cells.

FIG. 3 shows a block diagram of an arrangement including the memory cell array. The arrangement comprises a plurality of memory cells 100 which are arranged as an array having rows and columns. The memory cells 100 arranged in the same row are connected to the same one of the plurality of wordlines 40, 50. The arrangement further comprises a plurality of bitlines 21, 21a, 22, 22a, 22b. Each bitline 21, 21a, 22, 22a, 22b is located between two adjacent columns of memory cells 100 and connects the memory cells located on either side of that bitline 21, 21a, 22, 22a, 22b. Thus, each memory cell 100 is connected to one wordline 40, 50 and to two adjacent bitlines 21, 21a, 22, 22a, 22b.

Programming and erasing of the memory cells 100 is performed by a programming unit 2. The programming unit 2 comprises a wordline decoder 2Y coupled to the wordlines 40, 50 which is operable to apply programming and erasing potentials to the wordlines 40, 50. The programming unit 2 further comprises a bitline decoder 2X coupled to the bitlines 21, 21a, 22, 22a, 22b by means of the switches 25, 25a, 26, 26a, 26b. The bitline decoder 2X is operable to apply the programming and erasing potentials to the bitlines 21, 21a, 22, 22a, 22b. Alternatively, the wordline decoder may be called x-decoder and the bitline decoder may be called y-decoder.

The respective programming and erasing potentials are supplied to the bitlines 21, 21a, 22, 22a, 22b by means of a first and a second main bitline 31, 32 which are connectable to the bitlines 21, 21a, 22, 22a, 22b. The first main bitline 31 is coupled via first switches 25, 25a to odd-numbered bitlines 21, 21a and the second main bitline 32 is coupled via second switches 26, 26a, 26b to even-numbered bitlines 22, 22a, 22b.

The programming unit 2 is operable to identify the memory cells 100a, 100b to be programmed or to be erased and to select the wordlines 40, 50 and the bitlines 21, 21a, 22, 22a, 22b which are connected to these memory cells 100a, 100b in order to program or erase. The programming unit 2 is operable to control the switches 25, 25a, 26, 26a, 26b in order to perform programming and erasing.

Writing data into the memory cell array may comprise the steps of erasing all memory cells simultaneously or stepwise and then programming selected bits in order to store the data.

Programming the first bit 101 of a second memory cell 100b and the second bit 102 of a first memory cell 100a is performed during the same programming step. The first memory cell 100a and the second memory cell 100b are coupled by the same wordline 50 and the same bitline 21a. A first programming potential V1 is applied to the wordline 40, a second programming potential V2 is applied to the bitline 21a and a third programming potential V3 is applied to the adjacent bitlines 22a, 22b of the bitline 21a, which are coupled to the first memory cell 100a and to the second memory cell 100b, respectively. The second programming potential V2 is larger than the third programming potential V3 and the first programming potential V1 is larger than the second programming potential V2. The first programming potential V1 may be 9 V, the second programming potential V2 may be 4.5 V and the third programming potential V3 may be grounded.

Applying these programming potentials V1, V2, V3 at the same time causes a field in the first and the second memory cell 100a, 100b. Due to hot electron programming electrons are injected and trapped in the charge-trapping layers of the first and the second memory cell 100a, 100b in order to program the first bit 101 of the second memory cell 100b and to program the second bit 102 of the first memory cell 100a.

Programming is performed by applying pulses. This means that at least one of the programming potentials is applied as a sequence of pulses which enables to optimize programming by adjusting the number of pulses which are necessary to program the bit.

The first and the second programming potential V1, V2 are applied for a certain time interval. The third programming potential V3 is applied in consecutive pulses. A quantum of charges is injected into the charge-trapping layer while applying one pulse. The amount of charges depends on the programming potentials V1, V2, V3 and the pulse duration. The consecutive pulses of the programming potential V3 may the applied simultaneously to the bitlines 22a, 22b. Alternatively, the pulse are applied to the one of the bitlines 22a and 22b first and then to the other one of the bitlines 22a and 22b without discharging the bitline 21a. It is also possible to apply the pulses alternately to the bitline 22a and to the bitline 22b.

Applying consecutive pulses to the bitlines 22a, 22b without discharging the bitline 21a reduces the amount of energy to be loaded and reduces current consumption.

The second programming potential V2 is provided by the first main bitline 31 and the third programming potential V3 is provided by the second main bitline 32. The bitlines 21a, 22a, 22b are supplied with the respective programming potentials by means of the switches 25a, 26a, 26b connecting the main bitlines 31, 32 to the respective bitlines 21a, 22a, 22b in such a manner that consecutive pulses of the third programming potential V3 are applied while applying the second programming potential V2 for the certain time interval.

In a further embodiment, the first programming potential V1 may be applied in consecutive pulses while applying the second programming potential V2 and the third programming potential V3 for the certain time interval. It is also possible to apply the first programming potential V1, as well as the third programming potential V3 in consecutive pulses.

If only one of the first bits stored in the second memory cell and the second bit stored in the first memory cell is to be programmed, the third programming potential is applied only to the respective one of the bitlines adjacent to the bitline the second programming potential is applied to.

Figure 4:
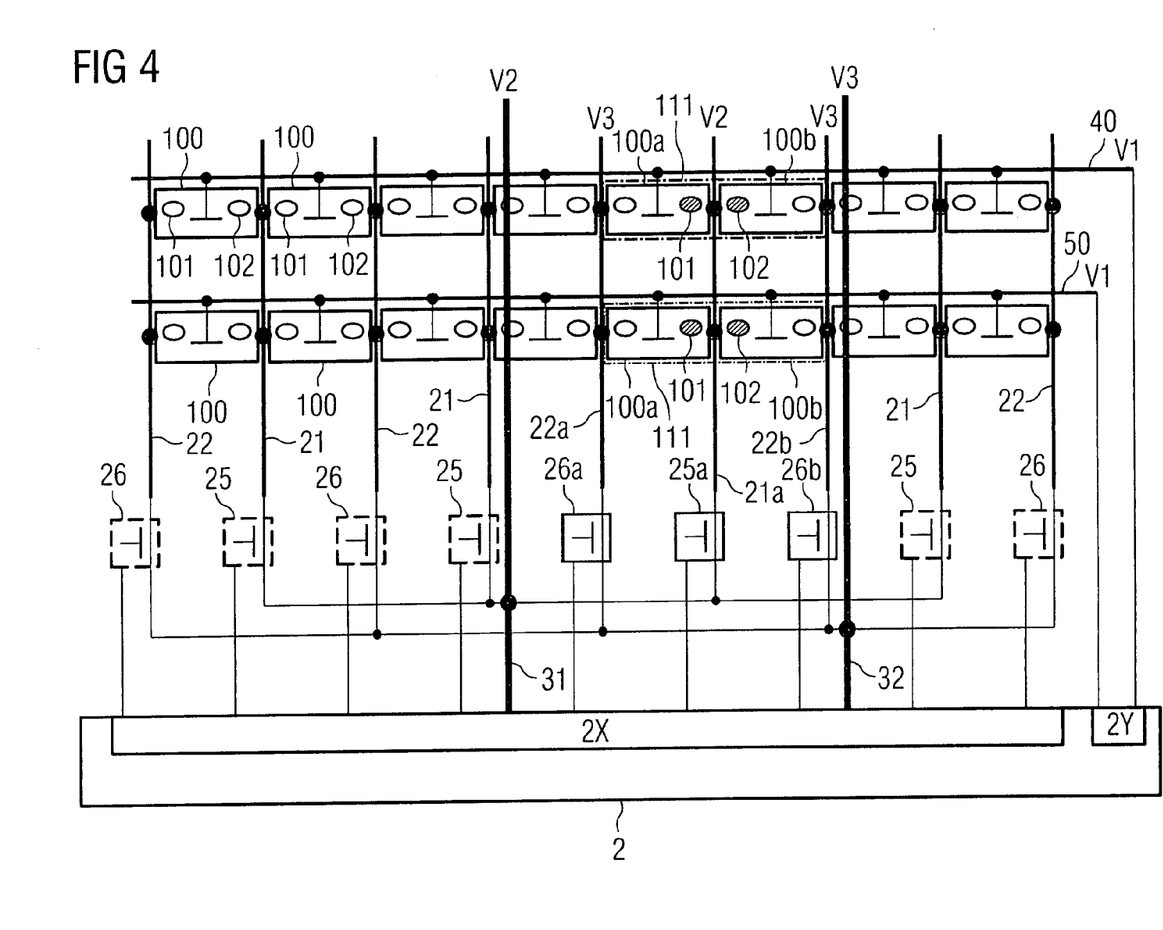
FIG. 4 shows the block diagram of the memory cell array illustrating programming in a column.

FIG. 4 shows the block diagram according to FIG. 3 with programming potentials V1, V2, V3 applied in order to program in a column.

The first programming potential V1 is applied to the wordlines 40, 50 which are connected to pairs 111 of memory cells 100a, 100b to be programmed. Each pair 111 includes a first and a second memory cell 100a, 100b. The first and the second memory cells 100a, 100b of the pairs 111 are connected by the bitline 21a. The second programming potential V2 is provided by the first main bitline 31 which is connected to the bitline 21a by means of the switch 25a. The third programming potential V3 is provided by the second main bitline 32 which is connected by means of the switches 26a, 26b to the bitlines 22a, 22b. Thus, the first bits 101 of the second memory cells 100b and the second bits 102 of the first memory cells 100a can be programmed in the same programming step. Consecutive pulses of the third programming potential V3 can be applied simultaneously to the bitlines 22a, 22b or alternately or to one of the bitlines 22a and 22b first and then to the other bitline 22a, 22b without discharging the bitline 21a.

Then the next column of pairs including first and second memory cells 100a, 100b, which are coupled to the same bitline, can be programmed by the proceedings described above.

Advantageously, the pairs including the first and the second memory cells, which are coupled by the odd-numbered bitlines 21, 21a, are programmed first. The second programming potential V2 is applied to the odd-numbered bitlines 21a one after another in order program pairs of memory cells in columns by means of the switches 25a, 25. The main bitlines do not need to discharge while performing these steps. Then the third programming potential V3 is applied to the first main bitline 31 in order to supply the third programming potential V3 to the odd-numbered bitlines 21a, 21. The second programming potential V2 is applied to the second main bitline 32, which supplies the second programming potential V2 to the even-numbered bitlines 22, 22a, 22b. Then the pairs of the first and the second memory cells which are coupled by the same even-numbered bitlines 22, 22a, 22b are programmed. Alternatively, the pairs coupled by the even-numbered bitlines 21, 21a are programmed first and then the pairs coupled by the odd-numbered bitlines 22, 22a, 22b are programmed. These proceedings reduce charging and discharging of the main bitlines 31, 32.

Figure 5:
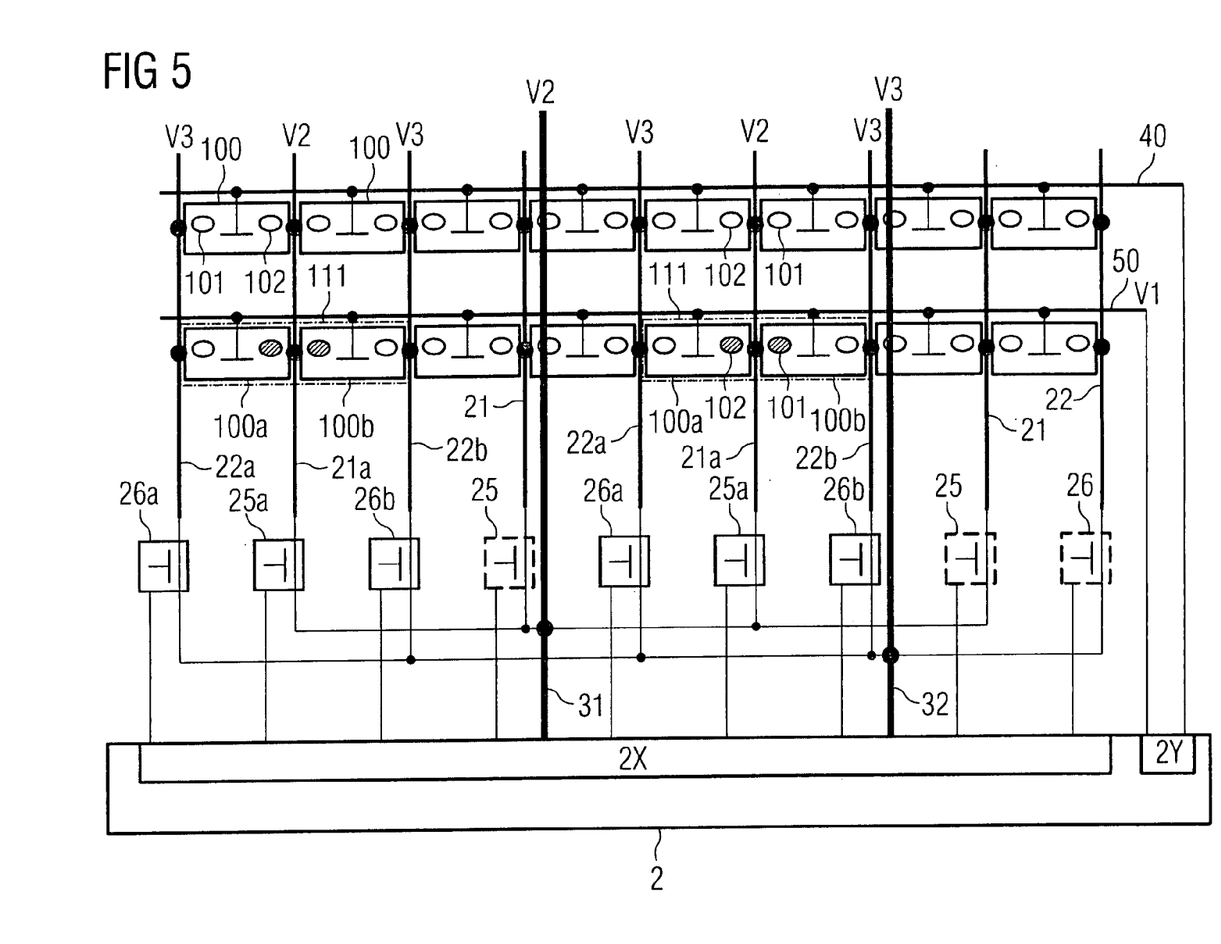
FIG. 5 shows the block diagram of the memory cell array illustrating a first step in order to program in a row.

FIG. 5 shows the block diagram according to FIG. 3 with programming potentials V1, V2, V3 applied in order to program in a row.

The first programming potential V1 is applied to one of the wordlines 50. The second programming potential V2 is applied to the odd-numbered bitlines 21a, which are coupled to the pairs 111 of the first and the second memory cells 100a, 100b to be programmed. The third programming potential V3 is applied to the even-numbered bitlines 22a, 22b adjacent to the bitlines 21a the second programming potential V2 is applied to. Alternatively, the third programming potential V3 may be applied to all even-numbered bitlines 22, 22a, 22b. The second programming potential V2 is supplied by the first main bitline 31 which is connected to the bitlines 21a by means of the switches 25a. The third programming potential V3 is supplied by the second main bitline 32 which is connected to the bitlines 22a, 22b by means of the switches 26a, 26b.

Thus, the first bits 101 of the second memory cells 100b and the second bits 102 of the first memory cells 100a can be programmed in the same programming step. Consecutive pulses of the third programming potential V3 can be applied simultaneously to the bitlines 22a, 22b or alternatingly or to one of the bitlines 22a and 22b first and then to the other bitlines without discharging the bitline 21a. The pulses are applied by means of the switches 26a, 26b, which are controlled by the programming unit 2.

Applying the third programming potential V3 simultaneously to the bitlines 22a, 22b may increase the programming speed because two bits are programmed at the same time. Applying the pulses to the bitlines 22a, 22b in rotation results in less current consumption. This approach permits to keep programming operation speed while reducing by half the number of bitlines charged up for consecutive programming pulses.

In a further embodiment, the first programming potential V1 may be applied in consecutive pulses while applying the second programming potential V2 and the third programming potential V3 for the certain time interval. It is also possible to apply the first programming potential V1 as well as the third programming potential V3 in consecutive pulses.

Figure 6:
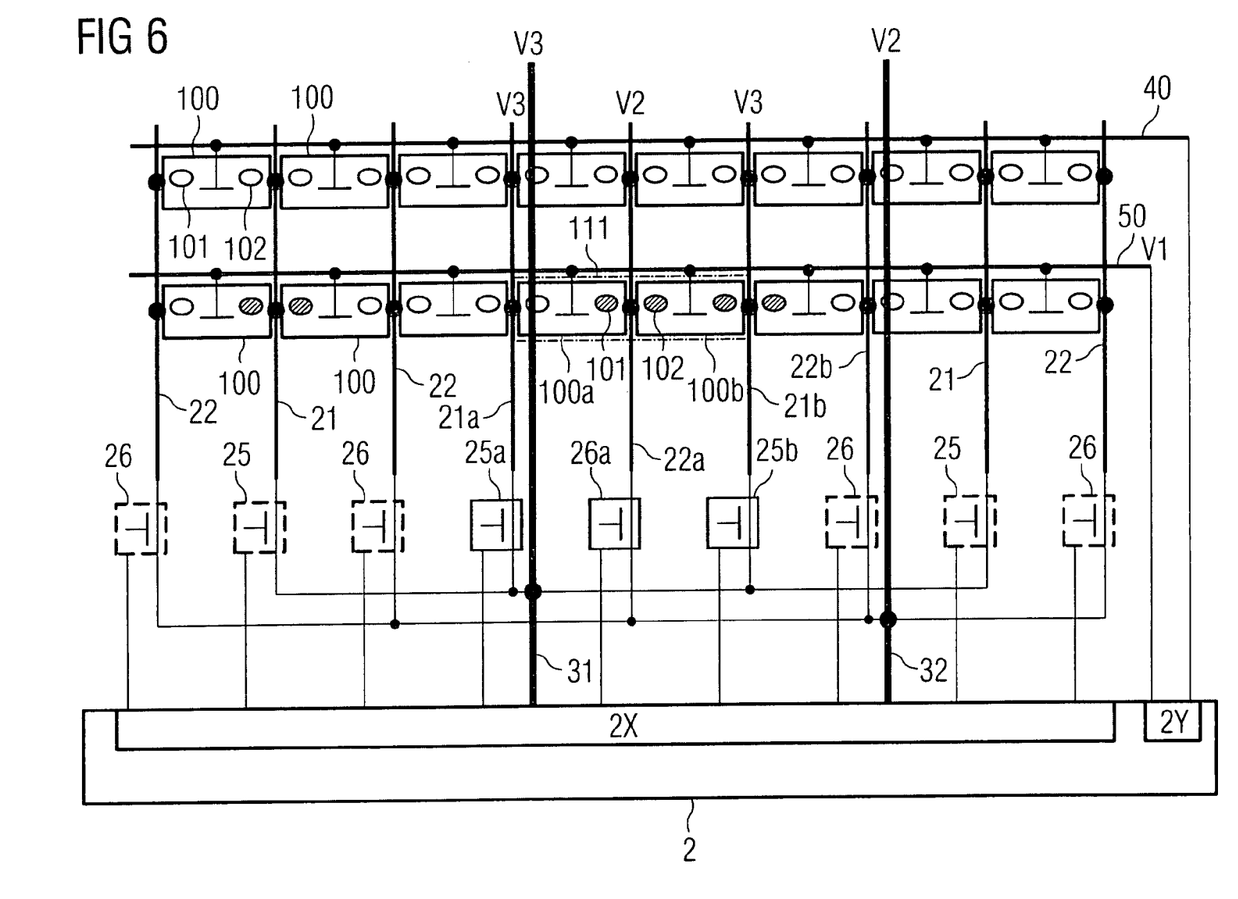
FIG. 6 shows the block diagram of the memory cell array illustrating a second step to program in a row.

FIG. 6 shows the block diagram according FIG. 5 in order to program pairs of the first and the second memory cells 100a, 100b connected to the even-numbered memory cells during the following programming step.

Pairs of the first and the second memory cells 100a, 100b which are connected by odd-numbered bitlines 21, 21a can be programmed during the first step as described above and illustrated in FIG. 5. During the following step pairs of the first and the second memory cell 100a, 100b connected by the same even-numbered bit line 22a are programmed. The second programming potential V2 is supplied by the second main bitline 32 which is connected to the even-numbered bitline 22a. The third programming potential V3 is supplied by the first main bitline 31 being connectable to the odd-numbered bitlines 21, 21a, 21b. The second programming potential V2 and the third programming potential V3 is coupled to the bitlines 22a and 21a, 21b, respectively, in order to program the first bit 101 of the second memory cells 100b and to program the second bit 102 of the first memory cells 100a.

In a further embodiment, the first programming potential V1 may be applied in consecutive pulses while applying the second programming potential V2 and the third programming potential V3 for the certain time interval. It is also possible to apply the first programming potential V1 as well as the third programming potential V3 in consecutive pulses.

The programming unit 2 is operable to perform applying the programming potentials in order to program pairs of memory cells as described above. In particular, programming pairs of memory cells in row or in a column is performed. The programming unit 2 enables to apply consecutive pulses of the first programming potential and/or the third programming potential without discharging the bitline the second programming potential V2 is applied to.

The required energy for charging the bitlines and the current consumption through the pump providing the bias potential for programming depends on the capacitive load of the wordlines and the bitlines.

A development of the programming unit 2 enables to determine the energy required to charge the wordlines and to determine the energy required to charge the bitlines in order to perform the programming step. The number of wordlines or bitlines depends on the number and location of the pairs of memory cells to be programmed. The required energy depends on a product of the capacitive load of each bitline or wordline, the programming potential to be applied and the number of bitlines or wordlines to be charged. Based on the required energy the programming unit is operable to switch between applying consecutive pulses of the first programming potential V1 and applying consecutive pulses of the third programming potential V2 in order to minimize the required energy for repeatedly charging. Switching may be performed independent of performing programming in a row or in a column.

What is claimed is:

1. A semiconductor memory device, comprising:
   a wordline;
   a first bitline;
   a second bitline;
   a third bitline;
   a first memory cell and a second memory cell, the first memory cell coupled to the wordline, the first bitline and the second bitline, the second memory cell coupled to the wordline, the first bitline and the third bitline, wherein each memory cell stores a first bit and a second bit;
   a programming unit coupled to the wordline, the first bitline, the second bitline and the third bitline, the programming unit causing the application of a first programming potential to the wordline and a third programming potential to the second and third bitlines while applying a second programming potential to the first bitline in order to program the first bit of the second memory cell and the second bit of the first memory cell.

2. The semiconductor memory device according to claim 1, wherein the programming unit is operable to apply the third programming potential simultaneously to the second and third bitlines while applying the second programming potential to the first bitline.

3. The semiconductor memory device according to claim 1, wherein the programming unit is operable to apply the third programming potential to one of the second or third bitlines and then to the other second or third bitline while applying the second programming potential to the first bitline.

4. The semiconductor memory device according to claim 1, wherein the programming unit is operable to apply the third programming potential in consecutive pulses to the second and third bitlines while applying the second programming potential to the first bitline continuously.

5. The semiconductor memory device according to claim 1, wherein the programming unit is operable to apply the third programming potential to one of the second or third bitlines and the other of the second or third bitlines alternately while applying the second programming potential to the first bitline continuously.

6. The semiconductor memory device according to claim 1, wherein the programming unit is operable to apply the first programming potential in consecutive pulses to the wordline while applying the second programming potential to the first bitline continuously.

7. The semiconductor memory device according to claim 1, wherein the programming unit is operable to switch between applying the first programming potential in consecutive pulses while applying the second programming potential continuously and applying the third programming potential in consecutive pulses while applying the second programming potential continuously.

8. The semiconductor memory device according to claim 1, wherein the first programming potential is higher than the second programming potential and the second programming potential is higher than the third programming potential.

9. A semiconductor memory device, comprising:
   a plurality of wordlines;
   a plurality of bitlines;

a plurality of memory cells coupled to the plurality of wordlines and the plurality of bitlines thereby forming a memory cell array, wherein each memory cell stores a first bit and a second bit;

a programming unit operable to apply a first programming potential to at least one of the wordlines and a third programming potential to second bitlines while applying a second programming potential to first bitline in order to program the first bit of second memory cells and the second bit of first memory cells, wherein the first memory cell and the second memory cell are coupled by a same wordline and the first bitline and wherein the first memory cell is coupled to one of the second bitlines and the second memory cell is coupled to the other of the second bitlines.

10. The semiconductor device according to claim 9, wherein the programming unit is operable to apply the third programming potential simultaneously to the two bitlines while applying the second programming potential to the first bitlines.

11. The semiconductor memory device according to claim 9, wherein the programming unit is operable to apply the third programming potential to a first group of second bitlines and then to a second group of second bitlines while applying the second programming potential to the first bitlines, wherein the first group includes the second bitlines coupled to the first memory cells and the second group includes the second bitlines coupled to the second memory cells.

12. The semiconductor memory device according to claim 9, wherein the programming unit is operable to apply the third programming potential in consecutive pulses to the second bitlines while applying the second programming potential to the at least one first bitline continuously.

13. The semiconductor memory device according to claim 9, wherein the programming unit is operable to apply the third programming potential to a first group of the second bitlines and to a second group of the second bitlines alternately while applying the second programming potential to the at least one first bitline continuously, wherein the first group includes the second bitlines coupled to the first memory cells and the second group includes the second bitlines coupled to the second memory cells.

14. The semiconductor memory device according to claim 9, wherein the programming unit is operable to apply the first programming potential in consecutive pulses to the at least one wordline while applying the second programming potential to the at least one first bitline continuously.

15. The semiconductor memory device according to claim 9, wherein the programming unit is operable to switch between applying the first programming potential in consecutive pulses to the at least one wordline while applying the second programming potential continuously and applying the third programming potential in consecutive pulses to the second bitlines while applying the second programming potential continuously.

16. The semiconductor memory device according to claim 9, wherein the first programming potential is higher than the second programming potential and the second programming potential is higher than the third programming potential.

17. A method for writing data into a semiconductor memory device that includes a first bit stored into a second memory cell and a second bit stored into a first memory cell, wherein the first memory cell and the second memory cell are coupled by a same wordline and a same first bitline and wherein the first memory cell and the second memory cell each coupled to a second bitline; the method comprising:

applying a first programming potential to the same wordline for a first time interval;

applying a second programming potential to the first bitline for a second time interval;

applying a third programming potential to one of the second bitlines for a third time interval, the first, the second and the third time interval overlapping;

applying the third programming potential to the other second bitline for a fourth time interval, the first, the second and the fourth time interval overlapping.

18. The method according to claim 17, wherein the third time interval and the fourth time interval are the same time interval.

19. The method according to claim 17, wherein the third and the fourth time interval do not overlap.

20. The method according to claim 17, wherein the third and the fourth time interval overlap.

21. The method according to claim 17, wherein the third programming potential is applied in consecutive pulses during the second time interval.

22. The method according to claim 17, wherein the third programming potential is applied alternately to one of the second bitlines and the other second bitline during the second time interval.

23. The method according to claim 17, wherein the first programming potential is applied in consecutive pulses during the second time interval.

24. A method for writing data into a semiconductor memory device that includes a plurality of bit pairs each comprising a first bit stored into a second memory cell and a second bit stored into a first memory cell, wherein the first memory cell and the second memory cell are coupled by a same one of a plurality of wordlines and a same one of a plurality of first bitlines, the first memory cell and the second memory cell each coupled to a second bitline; the method comprising:

applying a first programming potential to at least one of the wordlines for a first time interval;

applying a second programming potential to at least one of the first bitlines for a second time interval;

applying a third programming potential to the respective second bitlines, which are coupled to first memory cells, for a third time interval; the first, the second and the third time interval overlapping;

applying the third programming potential to the respective second bitlines, which are coupled to second memory cells, for a fourth time interval; the first, the second and the fourth time interval overlapping.

25. The method according to claim 24, wherein the third programming potential is supplied simultaneously to the second bitlines.

26. The method according to claim 24, wherein the third and the fourth time interval do not overlap.

27. The method according to claim 24, wherein the third and the fourth time interval overlap.

28. The method according to claim 24, wherein the third programming potential is applied in consecutive pulses during the second time interval.

29. The method according to claim 24, wherein the third programming potential is applied alternately to a first group of the second bitlines and to a second group of second bitlines alternately during the second time interval, wherein the first group includes the second bitlines coupled to the first memory cells and the second group includes the second bitlines coupled to the second memory cells.

30. The method according to claim 24, wherein the first programming potential is applied in consecutive pulses during the second time interval.

31. The method according to claim 24, wherein either the first programming potential is applied to one wordline or the second programming potential is applied to one first bitline.

32. The method according to claim 24, further comprising a step of selecting whether the third programming potential is applied in consecutive pulses during the second time interval or the first programming potential is applied in consecutive pulses during the second time interval, wherein selecting is based on the capacitive load of the bitlines and the wordlines the programming potentials are applied to.

* * * * *

UNITED STATES PATENT AND TRADEMARK OFFICE
CERTIFICATE OF CORRECTION

PATENT NO. : 7,295,477 B2 Page 1 of 1
APPLICATION NO. : 11/229003
DATED : November 13, 2007
INVENTOR(S) : de Ambroggi et al.

It is certified that error appears in the above-identified patent and that said Letters Patent is hereby corrected as shown below:

In Col. 5, line 9, delete "step" and insert --step in order--.

Signed and Sealed this

Twenty Second Day of April, 2008

JON W. DUDAS
*Director of the United States Patent and Trademark Office*